(12) United States Patent
Ye et al.

(10) Patent No.: US 12,203,607 B2
(45) Date of Patent: Jan. 21, 2025

(54) LIGHT-EMITTING ASSEMBLY WITH MICRO-PATTERNS AND VEHICLE INCLUDING LIGHT-EMITTING ASSEMBLY

(71) Applicant: FUYAO GLASS INDUSTRY GROUP CO., LTD., Fujian (CN)

(72) Inventors: Jiarong Ye, Fujian (CN); Xueping Chen, Fujian (CN); Jianzhao Yu, Fujian (CN); Zilong Xiao, Fujian (CN); Yunxiang Ye, Fujian (CN)

(73) Assignee: FUYAO GLASS INDUSTRY GROUP CO., LTD., Fujian (CN)

( * ) Notice: Subject to any disclaimer, the term of this patent is extended or adjusted under 35 U.S.C. 154(b) by 0 days.

(21) Appl. No.: 18/388,339

(22) Filed: Nov. 9, 2023

(65) Prior Publication Data

US 2024/0077178 A1    Mar. 7, 2024

Related U.S. Application Data

(63) Continuation of application No. PCT/CN2022/096739, filed on Jun. 2, 2022.

(30) Foreign Application Priority Data

Jun. 2, 2021    (CN) .......................... 202110615170.0

(51) Int. Cl.
*F21K 9/65* (2016.01)
*B60Q 3/208* (2017.01)
(Continued)

(52) U.S. Cl.
CPC ............... *F21K 9/65* (2016.08); *B60Q 3/208* (2017.02); *F21K 9/64* (2016.08); *F21W 2106/00* (2018.01); *F21Y 2115/10* (2016.08)

(58) Field of Classification Search
CPC .. F21K 9/65; F21K 9/64; B60Q 3/208; F21W 2106/00
See application file for complete search history.

(56) References Cited

U.S. PATENT DOCUMENTS

| | | |
|---|---|---|
| 2012/0320621 A1 | 12/2012 | Kleo et al. |
| 2014/0204601 A1 | 7/2014 | Bauerle et al. |

(Continued)

FOREIGN PATENT DOCUMENTS

| | | |
|---|---|---|
| CN | 1337589 A | 2/2002 |
| CN | 1378660 A | 11/2002 |

(Continued)

OTHER PUBLICATIONS

Wen Benhua et al., CN108278567A, machine translation, Mar. 2018 (Year: 2018).*

(Continued)

*Primary Examiner* — Tracie Y Green
(74) *Attorney, Agent, or Firm* — Scully, Scott, Murphy & Presser, P.C.

(57) ABSTRACT

A light-emitting assembly and a vehicle are provided in the disclosure. The light-emitting assembly includes a light-transmitting member and a pattern layer. The pattern layer is attached to a surface of the light-transmitting member and includes multiple micro-patterns arranged at intervals. Each of the multiple micro-patterns has a radial size ranging from 0.025 mm to 0.26 mm, and a distance between each two adjacent micro-patterns ranges from 0.2 mm to 1.5 mm. When the light-emitting assembly is powered on, the multiple micro-patterns are configured to emit light to enable the pattern layer to be visible. The light-emitting assembly provided in the disclosure can enhance the vehicle interior atmosphere.

20 Claims, 8 Drawing Sheets

(51) Int. Cl.
*F21K 9/64* (2016.01)
*F21W 106/00* (2018.01)
*F21Y 115/10* (2016.01)

(56) References Cited

U.S. PATENT DOCUMENTS

| | | |
|---|---|---|
| 2015/0078020 A1 | 3/2015 | Verrat et al. |
| 2017/0139109 A1 | 5/2017 | Gierens et al. |
| 2020/0276891 A1 | 9/2020 | Van Doleweerd et al. |
| 2020/0298534 A1* | 9/2020 | Berard ................ B60Q 3/51 |

FOREIGN PATENT DOCUMENTS

| | | |
|---|---|---|
| CN | 103196390 A | 7/2013 |
| CN | 104696876 A | 6/2015 |
| CN | 108278567 A | 7/2018 |
| CN | 109681835 A | 4/2019 |
| CN | 112622753 A | 4/2021 |
| EP | 3053778 A1 | 8/2016 |
| JP | 2011154998 A | 8/2011 |
| JP | 2013517989 A | 5/2013 |
| JP | 2020501325 A | 1/2020 |
| JP | 2020138725 A | 9/2020 |

OTHER PUBLICATIONS

International Search Report dated Aug. 23, 2022 issued in PCT/CN2022/096739.
Chinese First Office Action dated Jun. 14, 2022 issued in CN 202110615170.0.
Chinese Second Office Action dated Nov. 23, 2022 issued in CN 202110615170.0.
Extended European search report dated Sep. 6, 2024 received in European Patent Application No. 22815331.8.
Notice of Reasons for Refusal dated Nov. 20, 2024 received in Japanese Patent Application No. 2023-570164.

* cited by examiner

LIGHT-EMITTING ASSEMBLY WITH MICRO-PATTERNS AND VEHICLE INCLUDING LIGHT-EMITTING ASSEMBLY

CROSS-REFERENCE TO RELATED APPLICATION(S)

This application is a continuation of International Patent Application No. PCT/CN2022/096739, filed Jun. 2, 2022, which claims priority to Chinese Patent Application No. 202110615170.0, filed Jun. 2, 2021, the disclosures of which are hereby incorporated by reference in their entireties.

TECHNICAL FIELD

The disclosure relates to the technical field of vehicles, and in particular, to a light-emitting assembly and a vehicle.

BACKGROUND

With the improvement of living standards, requirements of people for quality of life are increasingly higher. For example, in the field of vehicles, people are demanding to enhance the vehicle interior atmosphere. Therefore, how to enhance the vehicle interior atmosphere becomes a research hotspot in recent years.

SUMMARY

A light-emitting assembly and a vehicle are provided in the disclosure. The light-emitting assembly can enhance the vehicle interior atmosphere.

A light-emitting assembly is provided in the disclosure. The light-emitting assembly includes a light-transmitting member and a pattern layer. The pattern layer is attached to a surface of the light-transmitting member and includes multiple micro-patterns arranged at intervals. Each of the multiple micro-patterns has a radial size ranging from 0.025 mm to 0.26 mm, and a distance between each two adjacent micro-patterns ranges from 0.2 mm to 1.5 mm. When the light-emitting assembly is powered on, the multiple micro-patterns are configured to emit light to enable the pattern layer to be visible.

The light-transmitting member includes a first light-transmitting layer, an adhesive layer, and a second light-transmitting layer. The adhesive layer is used to adhere the first light-transmitting layer to the second light-transmitting layer. The pattern layer is disposed between the first light-transmitting layer and the second light-transmitting layer or disposed on a surface of the second light-transmitting layer away from the first light-transmitting layer.

The second light-transmitting layer includes a light-incident surface and a light-exiting surface. The light-exiting surface is a surface of the second light-transmitting layer away from the first light-transmitting layer. The light-emitting assembly further includes a light-emitting member, and at least part of the light-emitting member faces the light-incident surface. The light-emitting member is configured to emit light that passes through the light-incident surface to enter the second light-transmitting layer. The pattern layer is configured to change a propagation path of the light to enable the light to exit from the second light-transmitting layer through the light-exiting surface.

The multiple micro-patterns are self-luminous, and the pattern layer is visible during photoluminescence of the multiple micro-patterns.

The light-incident surface and the light-exiting surface are connected in a bent manner. The light-incident surface is at least part of a peripheral surface of the second light-transmitting layer. The light-emitting member faces a periphery of the second light-transmitting layer.

The second light-transmitting layer defines an accommodating space. A side wall of the accommodating space serves as the light-incident surface, and the light-emitting member is at least partially accommodated in the accommodating space.

The pattern layer is disposed between the first light-transmitting layer and the second light-transmitting layer, and the light-incident surface is coplanar with the light-exiting surface.

A distance between the light-emitting member and the second light-transmitting layer ranges from 10 mm to 15 mm. The light-emitting assembly further includes a non-transparent cover plate. The cover plate is disposed at one side of the light-emitting member away from the first light-transmitting layer in a direction from the first light-transmitting layer to the second light-transmitting layer. The cover plate covers a gap between the light-emitting member and the second light-transmitting layer.

A distance between the light-emitting member and the second light-transmitting layer ranges from 0 mm to 10 mm. The light-emitting assembly further includes a non-transparent cover plate disposed at one side of the second light-transmitting layer away from the first light-transmitting layer. The cover plate covers the light-emitting assembly and at least part of the second light-transmitting layer. A region of the second light-transmitting layer covered by an orthogonal projection of the cover plate on the second light-transmitting layer is a coverage region. A size of the coverage region in a direction from the light-emitting member to the second light-transmitting layer ranges from 5 mm to 50 mm.

A distance between the light-emitting member and the second light-transmitting layer ranges from 0 mm to 10 mm. The light-emitting assembly further includes a non-transparent cover plate and a non-transparent light-shielding layer. In a direction from the first light-transmitting layer to the second light-transmitting layer, the cover plate is disposed at one side of the light-emitting member away from the first light-transmitting layer, and the light-shielding layer is disposed at one side of the second light-transmitting layer away from the first light-transmitting layer. A size of the light-shielding layer ranges from 5 mm to 40 mm in a direction from the light-emitting member to the second light-transmitting layer.

Each of the multiple micro-patterns has a thickness ranging from 0.01 mm to 0.03 mm.

Each of the multiple micro-patterns has a light transmittance ranging from 10% to 85%.

A vehicle is further provided in the disclosure. The vehicle includes a vehicle body and the light-emitting assembly mentioned above. The light-emitting assembly is carried on the vehicle body.

In the disclosure, when the light-emitting assembly is powered on, the micro-patterns allow the emitted light to exit through the light-exiting surface of the light-transmitting member to enable the pattern layer to be visible. When the light-emitting assembly is applied to the vehicle, the luminous pattern layer can be viewed by occupants inside the vehicle, thereby enhancing the vehicle interior atmosphere.

BRIEF DESCRIPTION OF THE DRAWINGS

In order to describe technical solutions in implementations of the disclosure more clearly, the following will give a brief introduction to accompanying drawings required for describing the implementations. Apparently, the accompanying drawings hereinafter described merely illustrate some implementations of the disclosure. Based on the accompanying drawings, those of ordinary skills in the art can also obtain other drawings without creative effort.

FIG. 2 is a schematic diagram of a light-emitting assembly provided in implementations of the disclosure when the light-emitting assembly is powered on.

FIG. 4 is a schematic diagram of a light-emitting assembly provided in implementations of the disclosure when the light-emitting assembly is not powered on.

Reference signs: vehicle—1, vehicle body—10, light-emitting assembly—20, light-transmitting member—210, first light-transmitting layer—211, second light-transmitting layer—212, adhesive layer—213, pattern layer—220, micro-pattern—221, light-emitting member—230, circuit board—231, bearing portion—2311, extension portion—2312, light-emitting diode (LED)—232, cover plate—240, light-shielding layer—250, accommodation space—K1, accommodating space—K2, receiving space—K3, light-incident surface—M1, light-exiting surface—M2.

DETAILED DESCRIPTION

The technical solutions in implementations of the disclosure are clearly and completely described hereinafter with reference to accompanying drawings in the implementations of the disclosure. Apparently, the described implementations are merely part of rather than all of the implementations of the disclosure. All other implementations obtained by those of ordinary skill in the art based on the implementations provided herein without creative efforts shall fall within the scope of the disclosure.

The terms "first", "second", and the like used in the specification, the claims, and the accompany drawings of the disclosure are used to distinguish different objects rather than describe a particular order. The terms "include", "comprise", and "have" as well as variations thereof are intended to cover non-exclusive inclusion. For example, a process, method, system, product, or apparatus including a series of steps or units is not limited to the listed steps or units, it can optionally include other operations or units that are not listed; alternatively, other operations or units inherent to the process, method, product, or device can be included either.

The term "implementation" or "embodiment" referred to herein means that a particular feature, structure, or feature described in conjunction with the implementation or embodiment may be contained in at least one implementation of the disclosure. The phrase appearing in various places in the specification does not necessarily refer to the same implementation, nor does it refer to an independent or alternative implementation that is mutually exclusive with other implementations. It is explicitly and implicitly understood by those skilled in the art that the implementations described herein may be combined with other implementations unless contradictions arise when combining at least two implementations.

Figure 1:
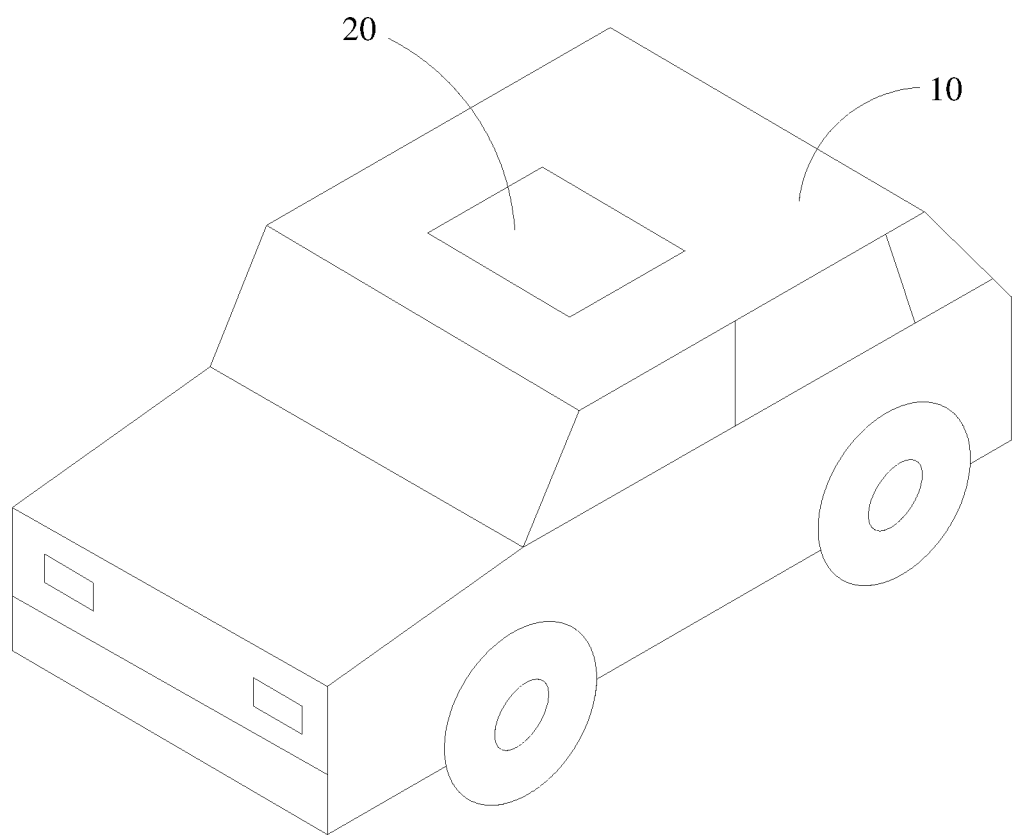
FIG. 1 is a schematic diagram of a vehicle provided in implementations of the disclosure.

Referring to FIG. 1, a vehicle 1 is provided in the disclosure. The vehicle 1 includes a vehicle body 10 and a light-emitting assembly 20 that is described in any one of the following implementations. The light-emitting assembly 20 is carried on the vehicle body 10. The light-emitting assembly 20 may be, but is not limited to, a sunroof of the vehicle 1. The sunroof is mounted to an upper cover of the vehicle 1, and external light can pass through the sunroof to enter the vehicle 1. In the following implementations of the disclosure, an example that the light-emitting assembly 20 is a sunroof is taken for exemplary illustration. The vehicle body 10 refers to a main structural member or an electronic member of which the vehicle 1 is composed. For example, the vehicle body 10 may include a vehicle frame, a seat, etc.

The light-emitting assembly 20 in the vehicle 1 provided in the foregoing implementations is described below in detail with reference to the accompanying drawings.

Figure 2:
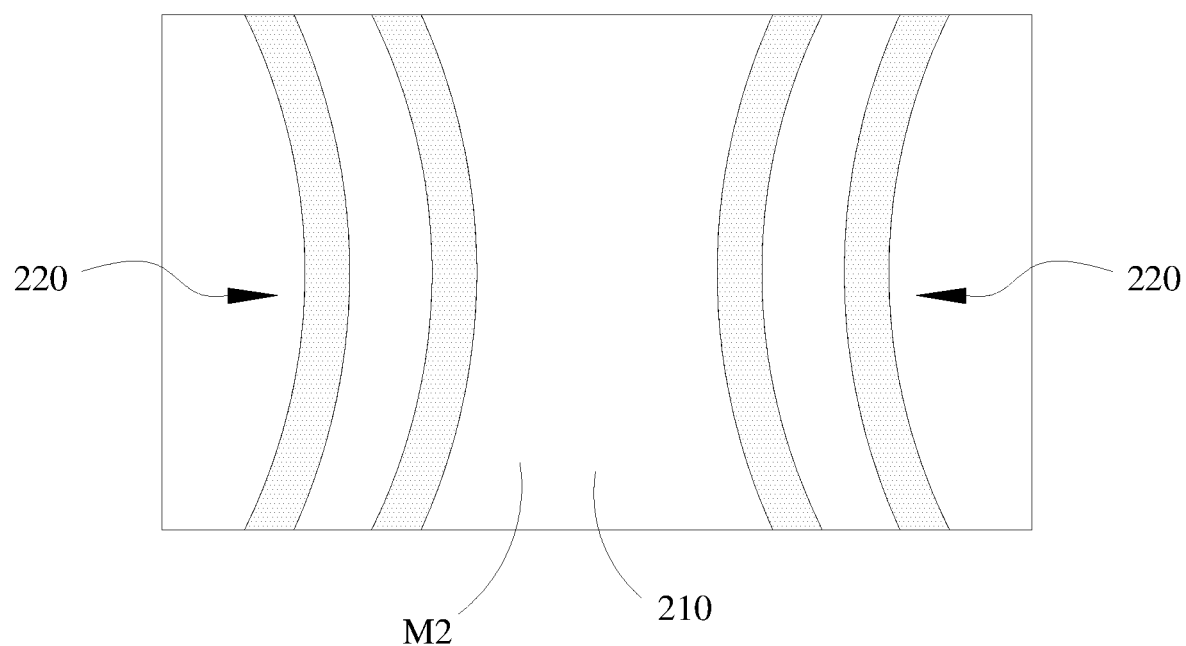
Figure 3:
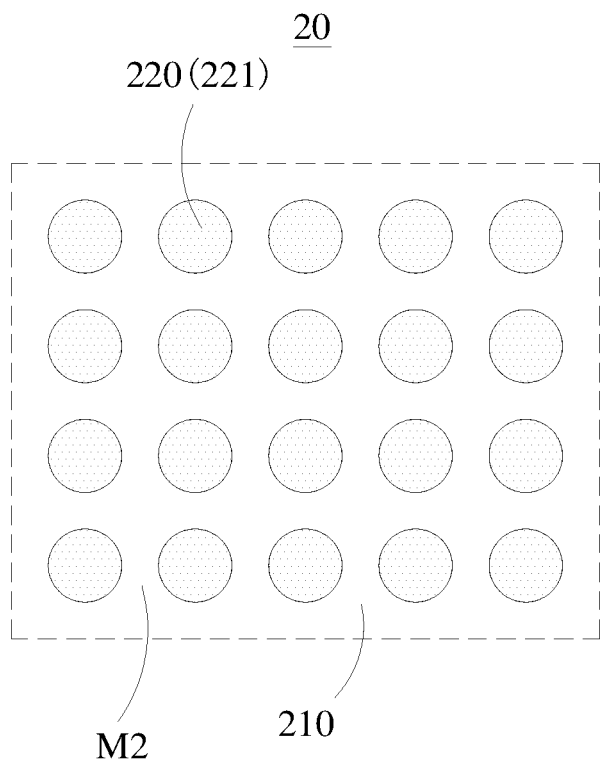
FIG. 3 is a partial schematic diagram of a pattern layer provided in implementations of the disclosure.

Referring to FIG. 2 and FIG. 3, the light-emitting assembly 20 is provided in the disclosure. The light-emitting assembly 20 includes a light-transmitting member 210 and a pattern layer 220. The light-emitting assembly 20 may be made of a material including, but not limited to, glass, transparent plastic, etc. The patterned layer 220 is attached to a surface of the light-transmitting member 210. The pattern layer 220 may be formed on the light-transmitting member 210 in a manner including, but not limited to, printing, spraying, etc. The pattern layer 220 includes multiple micro-patterns 221, that is, the pattern layer 220 consists of the multiple micro-patterns 221. Each of the multiple micro-patterns 221 may be in a shape of a circle, an oval, a triangle, a rectangle, a prism, or a polygon with a number of sides greater than or equal to 5. A pattern presented by the pattern layer 220 as a whole may be numbers, Chinese characters, symbols, figures, etc., which is specifically set according to requirements and is not limited herein. The multiple micro-patterns 221 are arranged at intervals. Each micro-pattern 221 has a radial size ranging from 0.025 mm to 0.26 mm, that is, the micro-pattern 221 may be any pattern in a circle with a diameter ranging from 0.025 mm to 0.15 mm. A distance between each two adjacent micro-patterns ranges from 0.2 mm to 1.5 mm.

It needs to be noted that, the micro-patterns 221 may be arranged at equal intervals. Alternatively, the micro-patterns 221 may also be arranged at unequal intervals, which can eliminate Moire fringe, and reduce uneven light emission of the whole pattern through interval adjustment.

As illustrated in FIG. 2, when the light-emitting assembly 20 is powered on, the multiple micro-patterns 221 are configured to emit light to enable the pattern layer 220 to be visible, and thus the luminous pattern layer 220 can be viewed by an occupant inside the vehicle 1, thereby enhancing the vehicle interior atmosphere. A light-emitting principle of the micro-pattern 221 is specifically introduced in detail in subsequent implementations.

It can be understood that, if the micro-pattern 221 is set to have a too large size, the pattern layer 220 may remain conspicuously visible even when the light-emitting assembly 20 is not powered on, that is, the pattern layer 220 can be directly viewed by the occupant inside the vehicle at a relatively long distance. This could result in at least three issues. First, since the atmosphere effect are typically used during the evening, the pattern layer 220 that remains visible during the daytime may block part of a visible region and thus part of a sight of the occupant may be blocked, diminishing driving experience of the occupant. Second, the continuous visibility of the pattern layer 220 to the occupant inside the vehicle may inevitably lead to aesthetic fatigue over a prolonged period. Third, under normal conditions, the atmosphere effect in the vehicle is coordinated as a whole, thus when other atmosphere light sources in the vehicle are not turned on, the continuous visibility of the pattern layer 220 may disrupt coordination of interior atmosphere of the vehicle.

Figure 4:
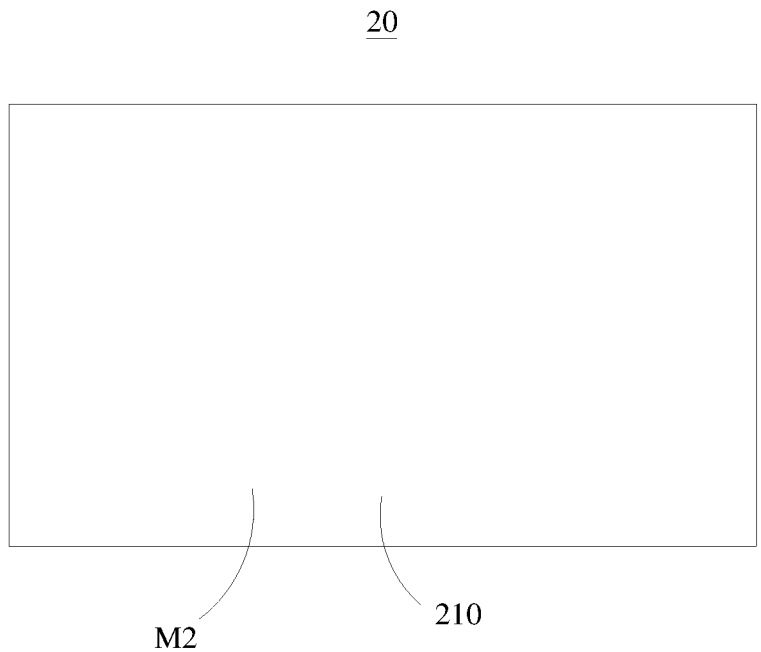

In the implementations of the disclosure, the micro-pattern 221 is designed to have a relatively small size of a micron level. When the light-emitting assembly 20 is not powered on, the pattern layer 220 composed of the multiple micro-patterns 221 is imperceptible to human eyes at a certain distance (greater than or equal to 230 mm). That is, when the light-emitting assembly 20 is not powered on, the pattern layer 220 is in a "hidden" state (as illustrated in FIG. 4), thereby overcoming the foregoing three issues.

Optionally, the micro-pattern 221 has a thickness ranging from 0.01 mm to 0.03 mm.

Since the micro-pattern 221 is set to have a relatively small size, the micro-pattern 221 can allow light to pass through or does not allow light to pass through. Optionally, the micro-pattern 221 can allow light to pass through, and the micro-pattern 221 has a light transmittance ranging from 10% to 85%. It can be understood that, if the micro-pattern 221 has a certain light transmittance, the pattern layer 220 may be less noticeable for the occupant inside the vehicle. That is, when the light-emitting assembly 20 is not powered on, the pattern layer 220 has relatively good "hidden" effect.

Figure 5:
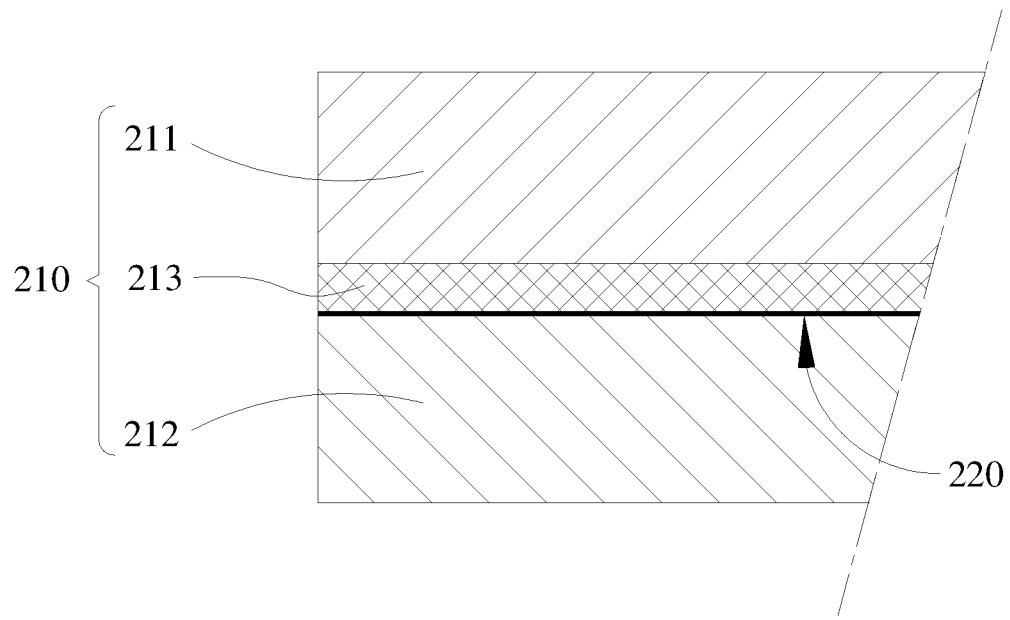
FIG. 5 is a partial schematic cross-sectional view of a light-emitting assembly provided in an implementation of the disclosure.
Figure 6:
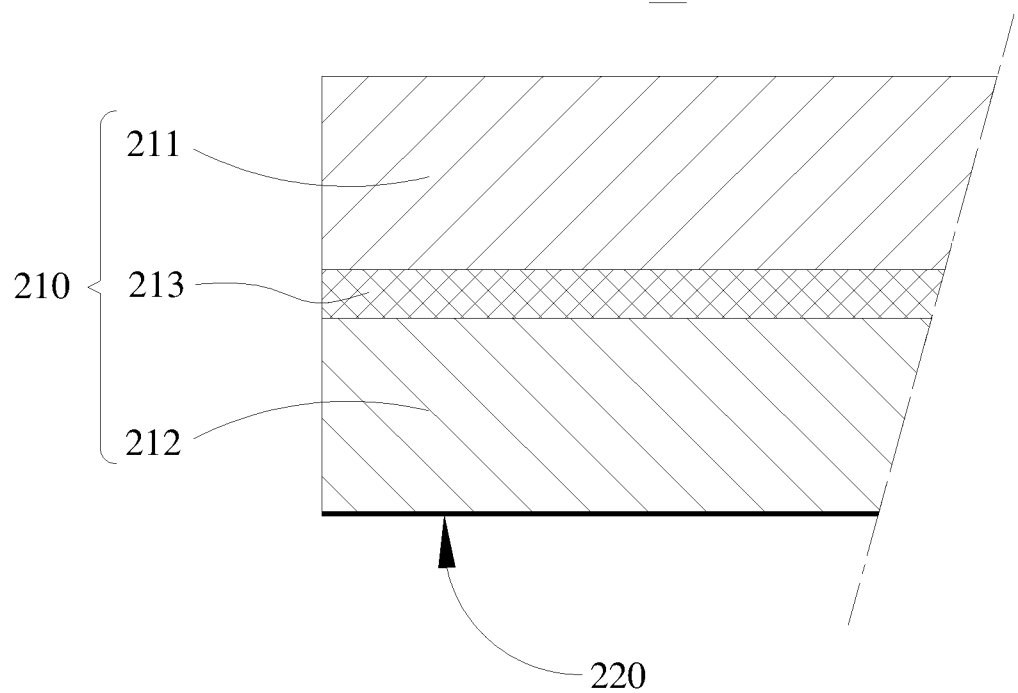
FIG. 6 is a partial schematic cross-sectional view of a light-emitting assembly provided in another implementation of the disclosure.

Referring to FIG. 5 and FIG. 6, the light-transmitting member 210 includes a first light-transmitting layer 211, an adhesive layer 213, and a second light-transmitting layer 212 that are stacked. The adhesive layer 213 is used to adhere the first light-transmitting layer 211 to the second light-transmitting layer 212. The first light-transmitting layer 211 and the second light-transmitting layer 212 each may be made of a material including, but not limited to, glass, plastic, etc. The first light-transmitting layer 211 faces the outside of the vehicle 1, and the second light-transmitting layer 212 faces the inside of the vehicle 1.

Referring to FIG. 5, in an implementation, the pattern layer 220 is disposed between the first light-transmitting layer 211 and the second light-transmitting layer 212. This arrangement can prevent a foreign object from damaging the pattern layer 220, thereby prolonging a service life. Specifically, the pattern layer 220 may be disposed between the first light-transmitting layer 211 and the adhesive layer 213, or alternatively, between the second light-transmitting layer 212 and the adhesive layer 213. The pattern layer 220 may be pre-formed on a surface of the first light-transmitting layer 211 or a surface of the second light-transmitting layer 212, and then the two light-transmitting layers are adhered together by the adhesive layer 213. The pattern layer 220 may also be pre-formed on a surface of the adhesive layer 213, and then the first light-transmitting layer 211 and the second light-transmitting layer 212 are adhered together by the adhesive layer 213 with the pattern layer 220 pre-formed thereon.

Referring to FIG. 6, in another implementation, the pattern layer 220 is disposed on a surface of the second light-transmitting layer 212 away from the first light-transmitting layer 211. It can be understood that, during adhering of the first light-transmitting layer 211 and the second light-transmitting layer 212 together by the adhesive layer 213, a certain external force is required to press the first light-transmitting layer 211 and the second light-transmitting layer 212 towards each other, thereby ensuring that the first light-transmitting layer 211 and the second light-transmitting layer 212 can be firmly adhered together. Therefore, compared with the previous implementation, the pattern layer 220 in the implementation is free from deformation caused by the pressure applied by the first light-transmitting layer 211 and the second light-transmitting layer 212, thereby ensuring that an original shape of the pattern layer 220 can be maintained.

A light-emitting principle of the pattern layer 220 is described below in detail with reference to the accompanying drawings.

In a first implementation, the micro-patterns 221 are self-luminous, and the pattern layer 220 is visible. That is to say, each micro-pattern 221 can achieve photoluminescence, and light from the multiple micro-patterns 221 enters human eyes to form an image. In a case where the pattern layer 220 is disposed between the first light-transmitting layer 211 and the second light-transmitting layer 212, light emitted from the pattern layer 220 passes through the second light-transmitting layer 212 before entering human eyes. In a case where the pattern layer 220 is disposed on the surface of the second light-transmitting layer 212 away from the first light-transmitting layer 211, light emitted from the pattern layer 220 can directly enter human eyes without passing through the second light-transmitting layer 212.

Referring to FIGS. 7 to 11, in a second implementation, the second light-transmitting layer 212 includes a light-incident surface M1 and a light-exiting surface M2. The light-exiting surface M2 is the surface of the second light-transmitting layer 212 away from the first light-transmitting layer 211. The light-emitting assembly 20 further includes a light-emitting member 230. At least part of the light-emitting member 230 faces the light-incident surface M1. The light-emitting member 230 is configured to emit light that passes through the light-incident surface M1 to enter the second light-transmitting layer 212. It needs to be noted that, the second light-transmitting layer 212 has a refractive index greater than air. When light arrives at an interface between the second light-transmitting layer 212 and air, total internal reflection occurs. When light arrives at an interface between the second light-transmitting layer 212 and the pattern layer 220, the pattern layer 220 is configured to change a propagation path of the light in the second light-transmitting layer 212 to enable the light to exit from the second light-transmitting layer 212 through the light-exiting surface M2. The total internal reflection is a phenomenon in which light arriving at the interface from a medium with a relatively high refractive index to a medium with a relatively low refractive index is not refracted into the medium with the relatively low refractive index but completely reflected back into the medium with the relatively high refractive index if the angle of incidence is greater than a certain critical angle θc (i.e., the light is away from the normal).

Optionally, the adhesive layer 213 has a refractive index lower than the second light-transmitting layer 212, and thus the light in the second light-transmitting layer 212 can be prevented from being refracted into the adhesive layer 213, thereby ensuring that sufficient light can be reflected out from the pattern layer 220.

The light-emitting member 230 includes a printed circuit board (PCB) 231 and multiple light-emitting diodes (LEDs) 232 electronically connected to the PCB 231. The LEDs can emit light of multiple colors, such that the pattern layer 220 can display different colors.

On the basis of the second implementation, different arrangements of the pattern layer 220 and the light-emitting member 230 are described below in detail with reference to the accompanying drawings.

Figure 7:
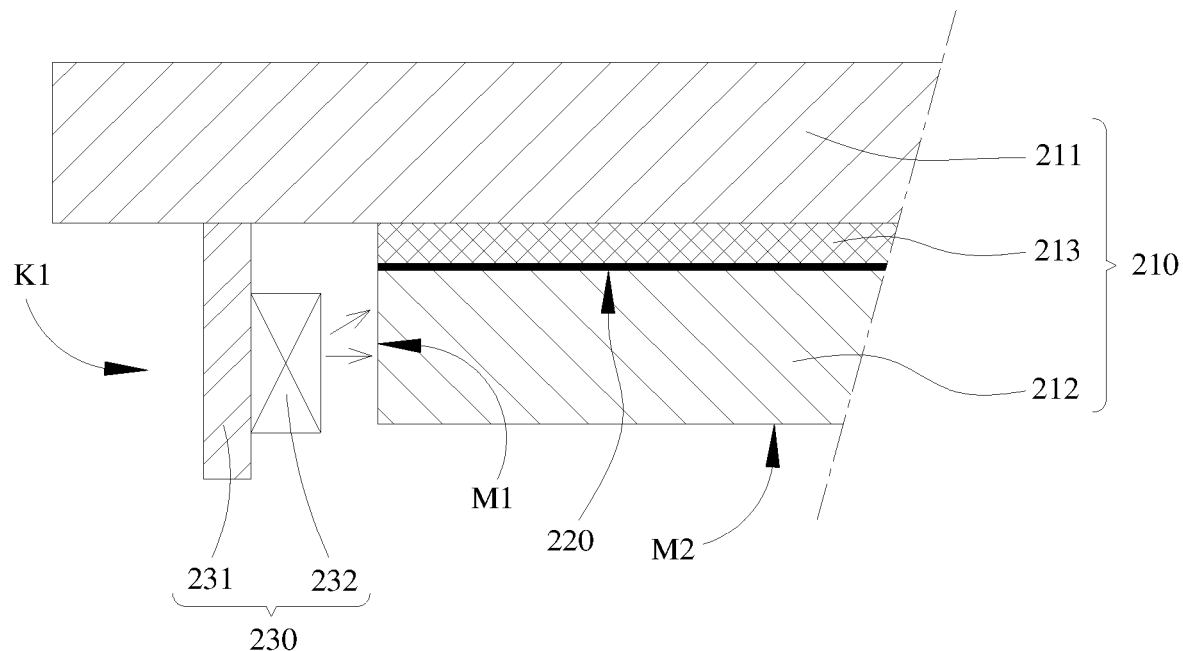
FIG. 7 is a partial schematic cross-sectional view of a light-emitting assembly provided in yet another implementation of the disclosure.
Figure 8:
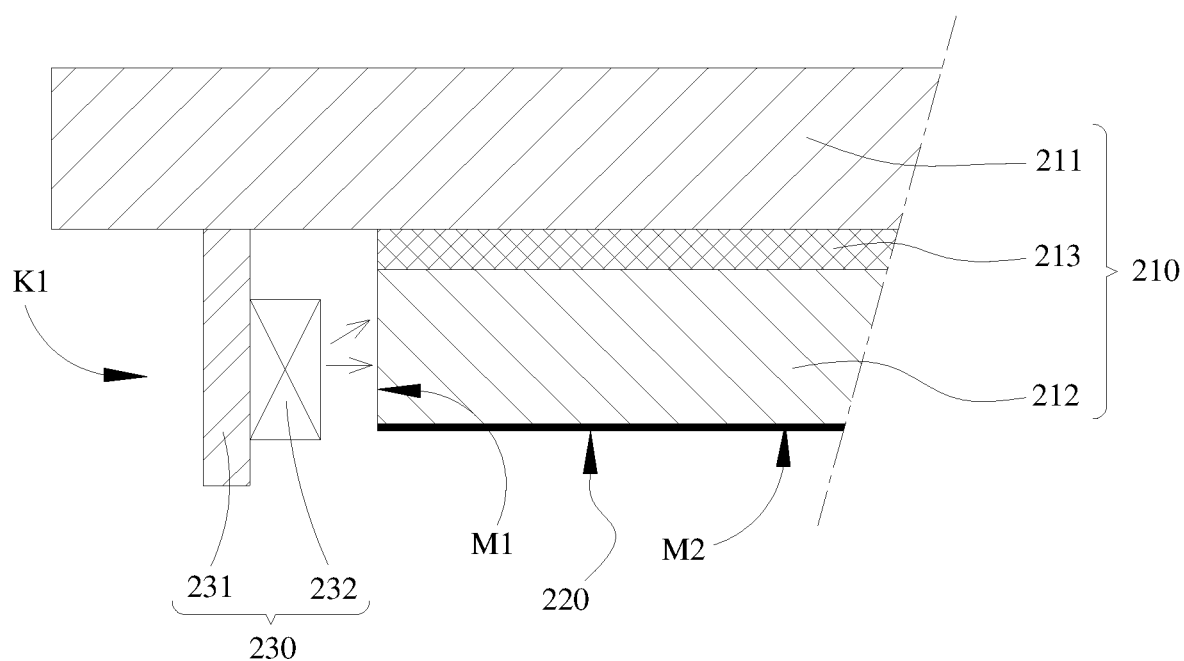
FIG. 8 is a partial schematic cross-sectional view of a light-emitting assembly provided in yet another implementation of the disclosure.

Referring to FIG. 7 and FIG. 8, in an implementation, the pattern layer 220 is disposed between the first light-transmitting layer 211 and the second light-transmitting layer 212. The light-incident surface M1 and the light-exiting surface M2 are connected in a bent manner. The light-incident surface M1 is at least part of a peripheral surface of the second light-transmitting layer 212. The light-emitting member 230 faces a periphery of the second light-transmitting layer 212. Specifically, the light-incident surface M1 is a side surface of the second light-transmitting layer 212, and the side surface is located at an edge of the second light-transmitting layer 212. The PCB is arranged along the edge of the second light-transmitting layer 212, and the multiple LEDs are arranged at intervals on the PCB along the edge of the second light-transmitting layer 212. The LEDs are configured to emit light towards the side surface of the second light-transmitting layer 212 when the LEDs are powered on. Optionally, the first light-transmitting layer 211 protrudes beyond the second light-transmitting layer 212 to define an accommodation space K1, and the light-emitting member 230 is accommodated in the accommodation space K1. With the structure, a portion of the first light-transmitting layer 211 protruding beyond the second light-transmitting layer 212 can protect the light-emitting member 230 from being damaged by a foreign object.

Referring to FIG. 7, the pattern layer 220 is disposed between the adhesive layer 213 and the second light-transmitting layer 212, when the light in the second light-transmitting layer 212 arrives at an interface between the second light-transmitting layer 212 and the micro-patterns 221, the light is reflected, the propagation path of the light is changed, and finally the light exits through the light-exiting surface M2. That is, the total internal reflection of the light in the second light-transmitting layer 212 is avoided, and thus the occupant inside the vehicle 1 can view the luminous pattern layer 220.

Referring to FIG. 8, the pattern layer 220 has a refractive index greater than the second light-transmitting layer 212. The pattern layer 220 is disposed on the surface of the second light-transmitting layer 212 away from the first light-transmitting layer 211 (namely, the pattern layer 220 is disposed on the light-exiting surface M2), when the light in the second light-transmitting layer 212 arrives at the interface between the second light-transmitting layer 212 and the micro-patterns 221, the light in the second light-transmitting layer 212 is refracted out from the micro-patterns 221. That is, the total internal reflection of the light in the second light-transmitting layer 212 is avoided, and thus the occupant inside the vehicle 1 can view the luminous pattern layer 220.

Figure 9:
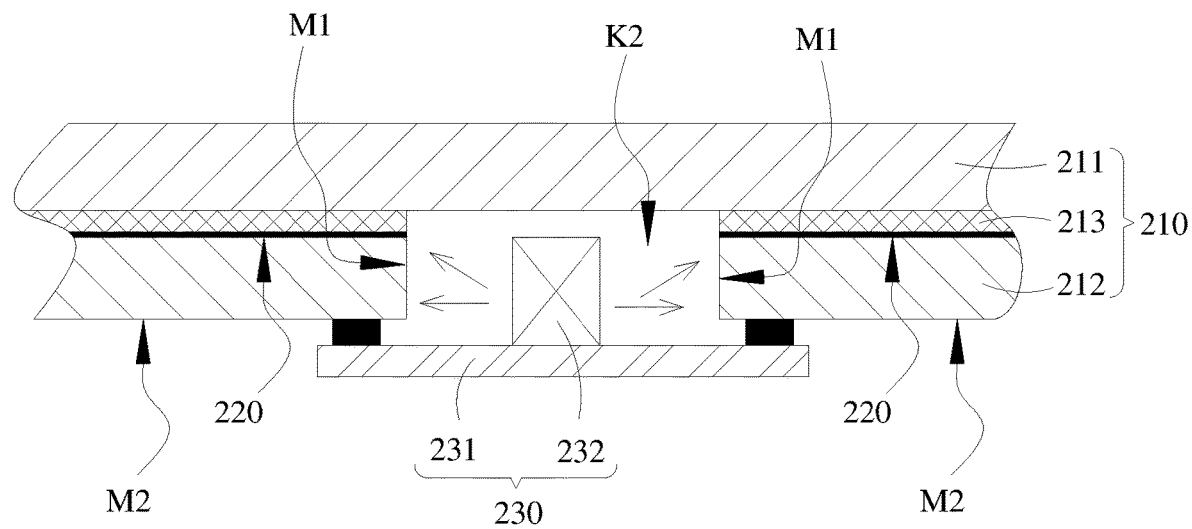
FIG. 9 is a partial schematic cross-sectional view of a light-emitting assembly provided in yet another implementation of the disclosure.
Figure 10:
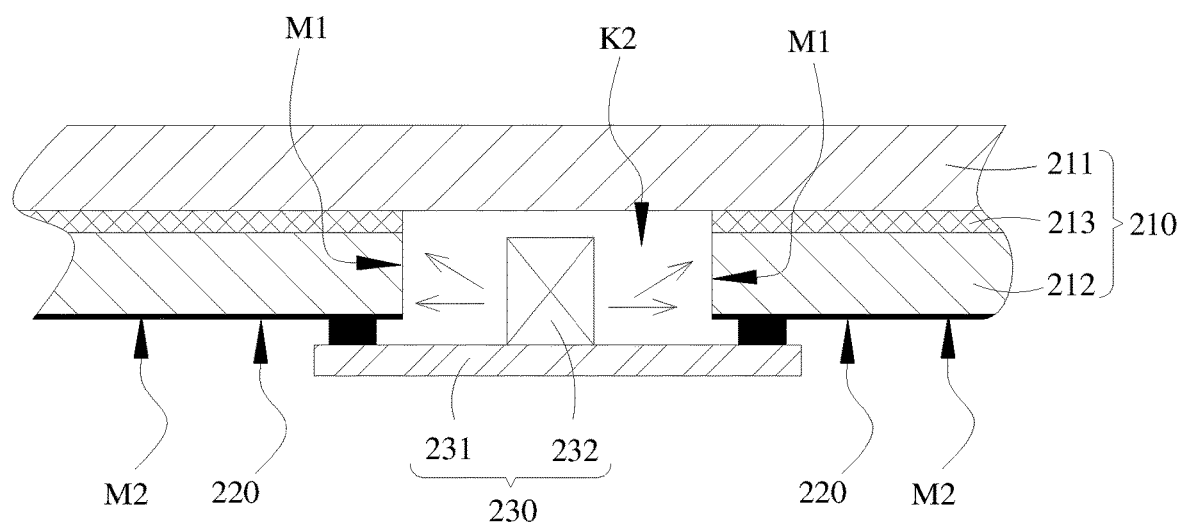
FIG. 10 is a partial schematic cross-sectional view of a light-emitting assembly provided in yet another implementation of the disclosure.

Referring to FIG. 9 and FIG. 10, in another implementation, the second light-transmitting layer 212 defines an accommodating space K2. A side wall of the accommodating space K2 serves as the light-incident surface M1. The light-emitting member 230 is at least partially accommodated in the accommodating space K2. Specifically, in a direction from the second light-transmitting layer 212 to the first light-transmitting layer 211, the accommodating space K2 may extend through the second light-transmitting layer 212, or may not extend through the second light-transmitting layer 212 (namely, the accommodating space K2 is a sink recess on the second light-transmitting layer 212). The PCB is connected to the second light-transmitting layer 212 and covers at least part of an opening of the accommodating space K2 in communication with the outside. At least part of the LEDs is received in the accommodating space K2. It can be understood that, the arrangement is beneficial to avoiding external damage to the LEDs and also beneficial to preventing light in the accommodating space K2 from escaping to the outside of the accommodating space K2, so that sufficient brightness of the pattern layer 220 can be ensured with less quantity of electricity.

Referring to FIG. 9, the pattern layer 220 is disposed between the adhesive layer 213 and the second light-transmitting layer 212, when the light in the second light-transmitting layer 212 arrives at the interface between the second light-transmitting layer 212 and the micro-patterns 221, the light is reflected, the propagation path of the light is changed, and finally the light exits through the light-exiting surface M2. That is, the total internal reflection of the light in the second light-transmitting layer 212 is avoided, and thus the occupant inside the vehicle 1 can view the luminous pattern layer 220.

Referring to FIG. 10, the refractive index of the pattern layer 220 is greater than that of the second light-transmitting layer 212. The pattern layer 220 is disposed on the surface of the second light-transmitting layer 212 away from the first light-transmitting layer 211 (namely, the pattern layer 220 is disposed on the light-exiting surface M2), when the light in the second light-transmitting layer 212 arrives at the interface between the second light-transmitting layer 212 and the micro-patterns 221, the light in the second light-transmitting layer 212 is refracted out from the micro-patterns 221. That is, the total internal reflection of the light in the second light-transmitting layer 212 is avoided, and thus the occupant inside the vehicle 1 can view the luminous pattern layer 220.

Figure 11:
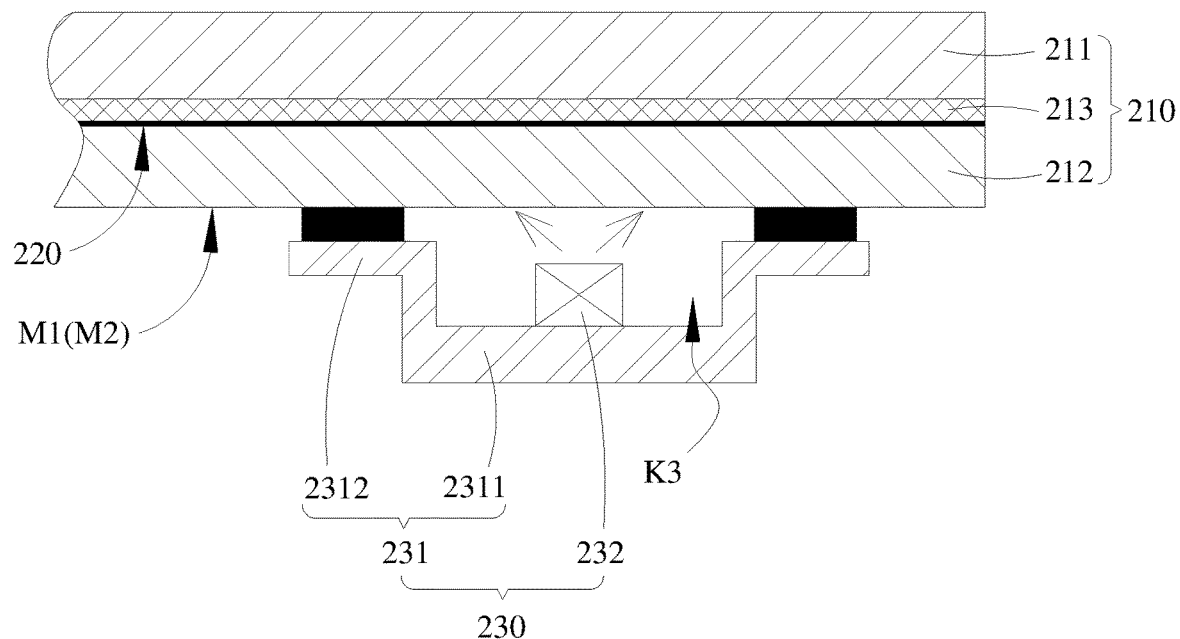
FIG. 11 is a partial schematic cross-sectional view of a light-emitting assembly provided in yet another implementation of the disclosure.

Referring to FIG. 11, in another implementation, the pattern layer 220 is disposed between the adhesive layer 213 and the second light-transmitting layer 212. The light-incident surface M1 is coplanar with the light-exiting surface M2, that is, a surface of the second light-transmitting layer 212 serves as both the light-incident surface M1 and the light-exiting surface M2. The PCB includes a bearing portion 2311 and an extension portion 2312. The bearing portion 2311 defines a receiving space K3, and the extension portion 2312 extends from a periphery of the bearing portion 2311 in a direction away from the receiving space K3. The LEDs are connected to the bearing portion 2311 and accommodated in the receiving space K3, and the extension portion 2312 is connected to the light-incident surface M1, where the structure is beneficial to preventing light emitted by the LEDs from being leaked out from the receiving space K3. The light emitted by the LEDs passes through the light-incident surface M1 to enter the second light-transmitting layer 212, and when the light in the second light-transmitting layer 212 arrives at the interface between the second light-transmitting layer 212 and the micro-patterns 221, the light is reflected, the propagation path of the light is changed, and finally the light exits through the light-exiting surface M2. That is, the total internal reflection of the light in the second light-transmitting layer 212 is avoided, and thus the occupant inside the vehicle 1 can view the luminous pattern layer 220. Optionally, the light-emitting member 230 is arranged close to the edge of the second light-transmitting layer 212, and an orthogonal projection of the light-emitting member 230 on the light-exiting surface M2 does not overlap an orthogonal projection of the pattern layer 220 on the light-exiting surface M2, so that the light-emitting member 230 may not block the pattern layer 220, which is beneficial to improving visual effect.

Tests show that, if a position relationship among the light-emitting member 230, the second light-transmitting layer 212, and the cover plate 240 is improperly set, the following technical problems may occur. First, since the LEDs of the light-emitting member 230 serve as light sources, granular light source effect may emerge at the edge of the second light-transmitting layer 212 close to the LEDs (hereinafter referred to as a granular issue for short). Second, scattering light may occur within a range of 10 mm in a direction in which the LEDs emit light, that is to say, when the LEDs emit mixed light of multiple colors except three primary colors, the mixed light of multiple colors may be visible within the range of 10 mm in the direction in which the LEDs emit light (hereinafter referred to as a scattering issue for short). The foregoing granular issue and scattering issue may adversely affect the viewing of the luminous pattern layer 220 by the occupant inside the vehicle and may result in incompatibility with atmosphere effect of the whole vehicle.

Three implementations for solving the foregoing granular issue and scattering issue are described below, and an example based on the structure illustrated in FIG. 7 and FIG. 8 is taken for exemplary illustration.

Figure 12:
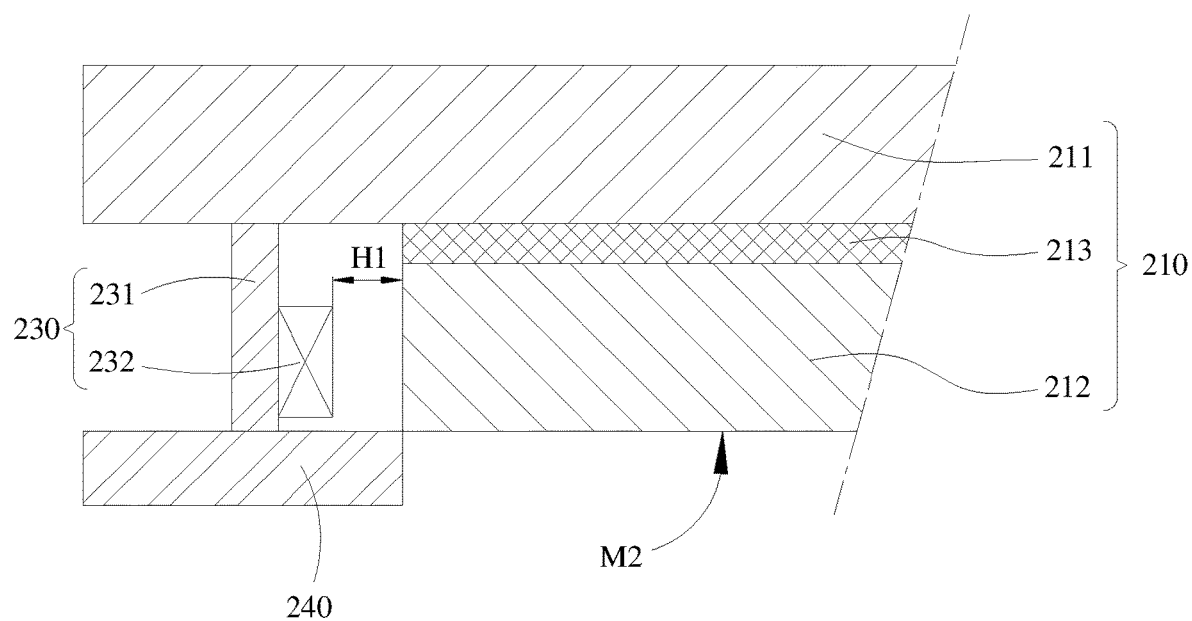
FIG. 12 is a partial schematic cross-sectional view of a light-emitting assembly provided in yet another implementation of the disclosure.

Referring to FIG. 12, in one implementation, a distance H1 between the light-emitting member 230 and the second light-transmitting layer 212 ranges from 10 mm to 15 mm. The light-emitting assembly 20 further includes a non-transparent cover plate 240. The cover plate 240 is disposed at one side of the light-emitting member 230 away from the first light-transmitting layer 211 in a direction from the first light-transmitting layer 211 to the second light-transmitting layer 212, and the cover plate 240 covers a gap between the light-emitting member 230 and the second light-transmitting layer 211. In other words, the cover plate 240 covers a range of 10 mm to 15 mm in a direction in which light exits from the light-emitting member 230. Optionally, the light-emitting member 230 is arranged close to the edge of the second light-transmitting layer 212, and an orthogonal projection of the light-emitting member 230 on the light-exiting surface M2 does not overlap an orthogonal projection of the pattern layer 220 on the light-exiting surface M2, so that the light-emitting member 230 may not block the pattern layer 220, which is beneficial to improving visual effect.

Figure 13:
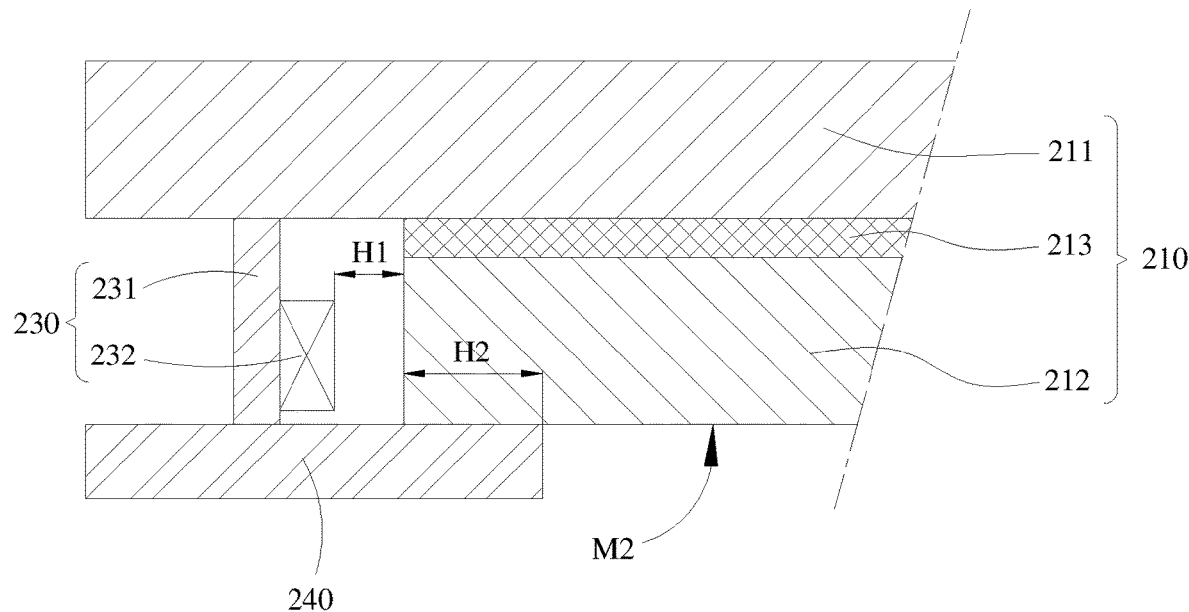
FIG. 13 is a partial schematic cross-sectional view of a light-emitting assembly provided in yet another implementation of the disclosure.

Referring to FIG. 13, in another implementation, the distance H1 between the light-emitting member 230 and the second light-transmitting layer 212 ranges from 0 mm to 10 mm. The light-emitting assembly 20 further includes a non-transparent cover plate 240. The cover plate 240 is disposed at one side of the second light-transmitting layer 212 away from the first light-transmitting layer 211, and covers the light-emitting assembly 20 and at least part of the second light-transmitting layer 212. When the distance H1 between the light-emitting member 230 and the second light-transmitting layer 212 is not zero (namely, a gap is defined therebetween), the cover plate 240 covers the gap between the light-emitting member 230 and the second light-transmitting layer 211. A region of the second light-transmitting layer 212 covered by an orthogonal projection of the cover plate 240 on the second light-transmitting layer 212 is a coverage region. A size of the coverage region (hereinafter referred to as a first coverage size H2 for short) in a direction from the light-emitting member 230 to the second light-transmitting layer 212 ranges from 5 mm to 50 mm. Specifically, when the distance H1 between the light-emitting member 230 and the second light-transmitting layer 212 is 0 mm, the first coverage size H2 ranges from 15 mm to 50 mm. When the distance H1 between the light-emitting member 230 and the second light-transmitting layer 212 is 10 mm, the first coverage size H2 ranges from 5 mm to 50 mm.

Figure 14:
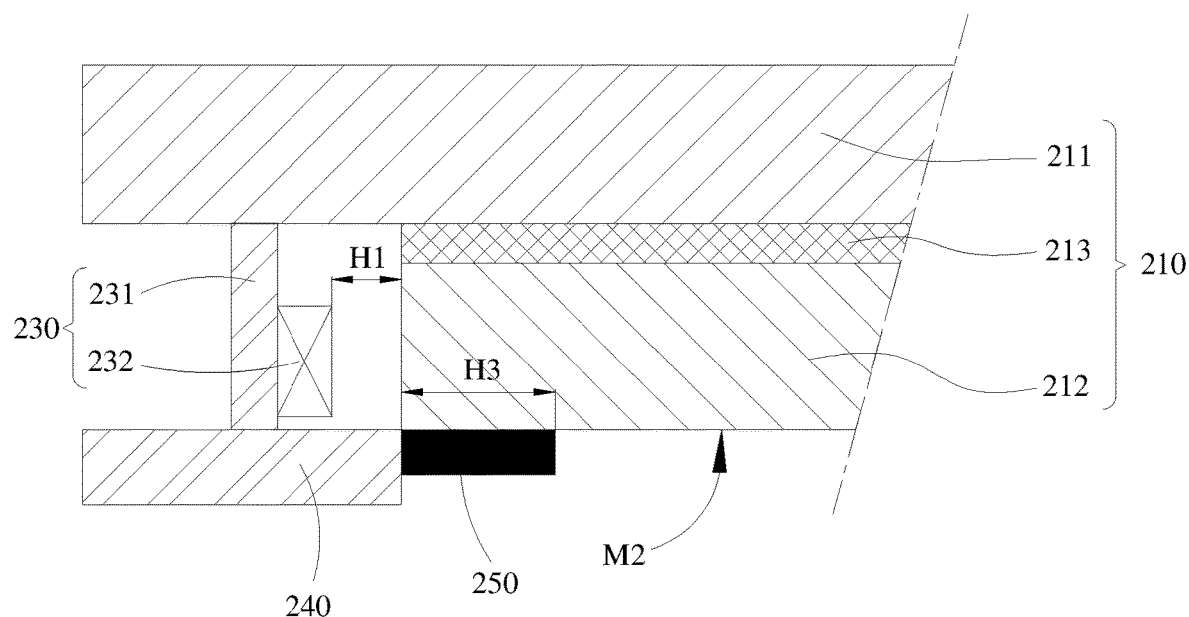
FIG. 14 is a partial schematic cross-sectional view of a light-emitting assembly provided in yet another implementation of the disclosure.

Referring to FIG. 14, in another implementation, the distance H1 between the light-emitting member 230 and the second light-transmitting layer 212 ranges from 0 mm to 10 mm. The light-emitting assembly 20 further includes a non-transparent cover plate 240 and a non-transparent light-shielding layer 250. The cover plate 240 is disposed at one side of the light-emitting member 230 away from the first light-transmitting layer 211 in a direction from the first light-transmitting layer 211 to the second light-transmitting layer 212. When the distance H1 between the light-emitting member 230 and the second light-transmitting layer 212 is not zero (namely, a gap is defined therebetween), the cover plate 240 covers the gap between the light-emitting member 230 and the second light-transmitting layer 211. The light-shielding layer 250 is disposed at one side of the second light-transmitting layer 212 away from the first light-transmitting layer 211. A size of the light-shielding layer 250 (hereinafter referred to as a second coverage size H3 for short) ranges from 5 mm to 40 mm in a direction from the light-emitting member 230 to the second light-transmitting layer 212. Specifically, when the distance H1 between the light-emitting member 230 and the second light-transmitting layer 212 is 0 mm, the second coverage size H3 ranges from 15 mm to 40 mm. When the distance H1 between the light-emitting member 230 and the second light-transmitting layer 212 is 10 mm, the second coverage size H3 ranges from 5 mm to 40 mm.

Although the implementations of the disclosure have been illustrated and described, it should be understood that the above implementations are illustrative and cannot be construed as limitations to the disclosure. Those skilled in the art can make changes, modifications, replacements, and variations to the above implementations within the scope of the disclosure, and these changes and modifications shall also belong to the scope of protection of the disclosure.

What is claimed is:

1. A light-emitting assembly, comprising a light-transmitting member and a pattern layer, wherein the pattern layer is attached to a surface of the light-transmitting member and comprises a plurality of micro-patterns arranged at intervals, wherein each of the plurality of micro-patterns has a radial size ranging from 0.025 mm to 0.26 mm, a distance between each two adjacent micro-patterns ranges from 0.2 mm to 1.5 mm, and wherein when the light-emitting assembly is powered on, the plurality of micro-patterns are configured to emit light to enable the pattern layer to be visible;

the light-transmitting member comprises a first light-transmitting layer, an adhesive layer, and a second light-transmitting layer, wherein the adhesive layer is used to adhere the first light-transmitting layer to the second light-transmitting layer, and the second light-transmitting layer comprises a light-incident surface and a light-exiting surface;

the light-emitting assembly further comprises a light-emitting member, wherein at least part of the light-emitting member faces the light-incident surface, and the light-emitting member is configured to emit light that passes through the light-incident surface to enter the second light-transmitting layer; and the adhesive layer has a refractive index lower than the second light-transmitting layer.

2. The light-emitting assembly of claim 1, wherein the pattern layer is disposed between the first light-transmitting layer and the second light-transmitting layer or disposed on a surface of the second light-transmitting layer away from the first light-transmitting layer.

3. The light-emitting assembly of claim 2, wherein the light-exiting surface is a surface of the second light-transmitting layer away from the first light-transmitting layer, and the pattern layer is configured to change a propagation path of the light to enable the light to exit from the second light-transmitting layer through the light-exiting surface.

4. The light-emitting assembly of claim 2, wherein the plurality of micro-patterns are self-luminous, and the pattern layer is visible during photoluminescence of the plurality of micro-patterns.

5. The light-emitting assembly of claim 3, wherein the light-incident surface and the light-exiting surface are connected in a bent manner, the light-incident surface is at least part of a peripheral surface of the second light-transmitting layer, and the light-emitting member faces a periphery of the second light-transmitting layer.

6. The light-emitting assembly of claim 3, wherein the second light-transmitting layer defines an accommodating space, wherein a side wall of the accommodating space serves as the light-incident surface, and the light-emitting member is at least partially accommodated in the accommodating space.

7. The light-emitting assembly of claim 3, wherein the pattern layer is disposed between the first light-transmitting layer and the second light-transmitting layer, and the light-incident surface is coplanar with the light-exiting surface.

8. The light-emitting assembly of claim 5, wherein a distance between the light-emitting member and the second light-transmitting layer ranges from 10 mm to 15 mm, and the light-emitting assembly further comprises a non-transparent cover plate, wherein the cover plate is disposed at one side of the light-emitting member away from the first light-transmitting layer in a direction from the first light-transmitting layer to the second light-transmitting layer, and the cover plate covers a gap between the light-emitting member and the second light-transmitting layer.

9. The light-emitting assembly of claim 5, wherein a distance between the light-emitting member and the second light-transmitting layer ranges from 0 mm to 10 mm, and the light-emitting assembly further comprises a non-transparent cover plate disposed at one side of the second light-transmitting layer away from the first light-transmitting layer, wherein the cover plate covers the light-emitting assembly and at least part of the second light-transmitting layer, a region of the second light-transmitting layer covered by an orthogonal projection of the cover plate on the second light-transmitting layer is a coverage region, and a size of the coverage region in a direction from the light-emitting member to the second light-transmitting layer ranges from 5 mm to 50 mm.

10. The light-emitting assembly of claim 5, wherein a distance between the light-emitting member and the second light-transmitting layer ranges from 0 mm to 10 mm, and the light-emitting assembly further comprises a non-transparent cover plate and a non-transparent light-shielding layer, wherein in a direction from the first light-transmitting layer to the second light-transmitting layer, the cover plate is disposed at one side of the light-emitting member away from the first light-transmitting layer, and the light-shielding layer is disposed at one side of the second light-transmitting layer away from the first light-transmitting layer; and a size of the light-shielding layer ranges from 5 mm to 40 mm in a direction from the light-emitting member to the second light-transmitting layer.

11. The light-emitting assembly of claim 1, wherein each of the plurality of micro-patterns has a thickness ranging from 0.01 mm to 0.03 mm.

12. The light-emitting assembly of claim 1, wherein each of the plurality of micro-patterns has a light transmittance ranging from 10% to 85%.

13. A vehicle, comprising a vehicle body and a light-emitting assembly carried on the vehicle body, wherein the light-emitting assembly comprises a light-transmitting member and a pattern layer, wherein the pattern layer is attached to a surface of the light-transmitting member and comprises a plurality of micro-patterns arranged at intervals, wherein each of the plurality of micro-patterns has a radial size ranging from 0.025 mm to 0.26 mm, a distance between each two adjacent micro-patterns ranges from 0.2 mm to 1.5 mm, and wherein when the light-emitting assembly is powered on, the plurality of micro-patterns are configured to emit light to enable the pattern layer to be visible;

the light-transmitting member comprises a first light-transmitting layer, an adhesive layer, and a second light-transmitting layer, wherein the adhesive layer is used to adhere the first light-transmitting layer to the second light-transmitting layer, and the second light-transmitting layer comprises a light-incident surface and a light-exiting surface;

the light-emitting assembly further comprises a light-emitting member, wherein at least part of the light-emitting member faces the light-incident surface, and the light-emitting member is configured to emit light that passes through the light-incident surface to enter the second light-transmitting layer; and the adhesive layer has a refractive index lower than the second light-transmitting layer.

14. The vehicle of claim 13, wherein the pattern layer is disposed between the first light-transmitting layer and the second light-transmitting layer or disposed on a surface of the second light-transmitting layer away from the first light-transmitting layer.

15. The vehicle of claim 14, wherein the light-exiting surface is a surface of the second light-transmitting layer away from the first light-transmitting layer, and the pattern layer is configured to change a propagation path of the light to enable the light to exit from the second light-transmitting layer through the light-exiting surface.

16. The vehicle of claim 14, wherein the plurality of micro-patterns are self-luminous, and the pattern layer is visible during photoluminescence of the plurality of micro-patterns.

17. The vehicle of claim 15, wherein the light-incident surface and the light-exiting surface are connected in a bent manner, the light-incident surface is at least part of a peripheral surface of the second light-transmitting layer, and the light-emitting member faces a periphery of the second light-transmitting layer.

18. The vehicle of claim 15, wherein the second light-transmitting layer defines an accommodating space, wherein a side wall of the accommodating space serves as the light-incident surface, and the light-emitting member is at least partially accommodated in the accommodating space.

19. The vehicle of claim 15, wherein the pattern layer is disposed between the first light-transmitting layer and the second light-transmitting layer, and the light-incident surface is coplanar with the light-exiting surface.

20. The vehicle of claim 17, wherein a distance between the light-emitting member and the second light-transmitting layer ranges from 10 mm to 15 mm, and the light-emitting assembly further comprises a non-transparent cover plate, wherein the cover plate is disposed at one side of the light-emitting member away from the first light-transmitting layer in a direction from the first light-transmitting layer to the second light-transmitting layer, and the cover plate covers a gap between the light-emitting member and the second light-transmitting layer.

* * * * *